(12) United States Patent
Nakakubo

(10) Patent No.: US 8,379,464 B2
(45) Date of Patent: Feb. 19, 2013

(54) SEMICONDUCTOR INTEGRATED CIRCUIT DEVICE

(75) Inventor: Atsushi Nakakubo, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 191 days.

(21) Appl. No.: 13/024,979

(22) Filed: Feb. 10, 2011

(65) Prior Publication Data

US 2011/0242896 A1 Oct. 6, 2011

(30) Foreign Application Priority Data

Mar. 31, 2010 (JP) ................................. 2010-081152

(51) Int. Cl.
*G11C 5/14* (2006.01)
(52) U.S. Cl. .......... 365/189.09; 365/189.11; 365/189.07
(58) Field of Classification Search ............. 365/189.09, 365/189.11, 189.07
See application file for complete search history.

(56) References Cited

U.S. PATENT DOCUMENTS

| 5,590,074 | A  | * | 12/1996 | Akaogi et al. | 365/185.22 |
|---|---|---|---|---|---|
| 5,663,911 | A  | * | 9/1997 | Kaneko | 365/189.11 |
| 6,535,425 | B2 | * | 3/2003 | Nawaki et al. | 365/185.18 |
| 6,744,669 | B2 | * | 6/2004 | Jahanshir et al. | 365/185.19 |
| 2002/0101762 | A1 | * | 8/2002 | Nawaki et al. | 365/185.01 |
| 2005/0078541 | A1 | * | 4/2005 | Nakamura | 365/226 |
| 2006/0007733 | A1 | * | 1/2006 | Tanzawa | 365/185.01 |
| 2006/0044889 | A1 | * | 3/2006 | Takahashi et al. | 365/189.11 |
| 2007/0103994 | A1 | * | 5/2007 | Ahmed et al. | 365/189.11 |
| 2007/0127299 | A1 | * | 6/2007 | Takahashi et al. | 365/189.09 |
| 2008/0266968 | A1 |   | 10/2008 | Mori | |
| 2012/0063244 | A1 | * | 3/2012 | Kwon et al. | 365/189.07 |

FOREIGN PATENT DOCUMENTS

JP 2008-269727 A 11/2008

* cited by examiner

*Primary Examiner* — Tuan T. Nguyen
(74) *Attorney, Agent, or Firm* — Arent Fox LLP

(57) ABSTRACT

A semiconductor device includes a booster circuit and a detector. The booster circuit is configured to boost an input voltage and output an output voltage, and the detector is configured to output the output voltage, which is output from the booster circuit, and control the booster circuit to generate a plurality of different voltages in accordance with an operating mode.

9 Claims, 12 Drawing Sheets

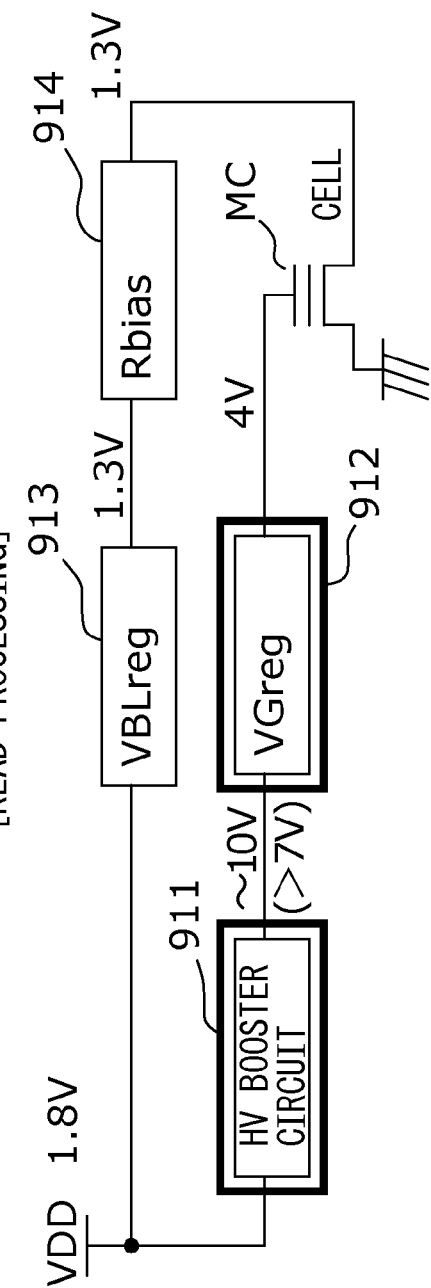
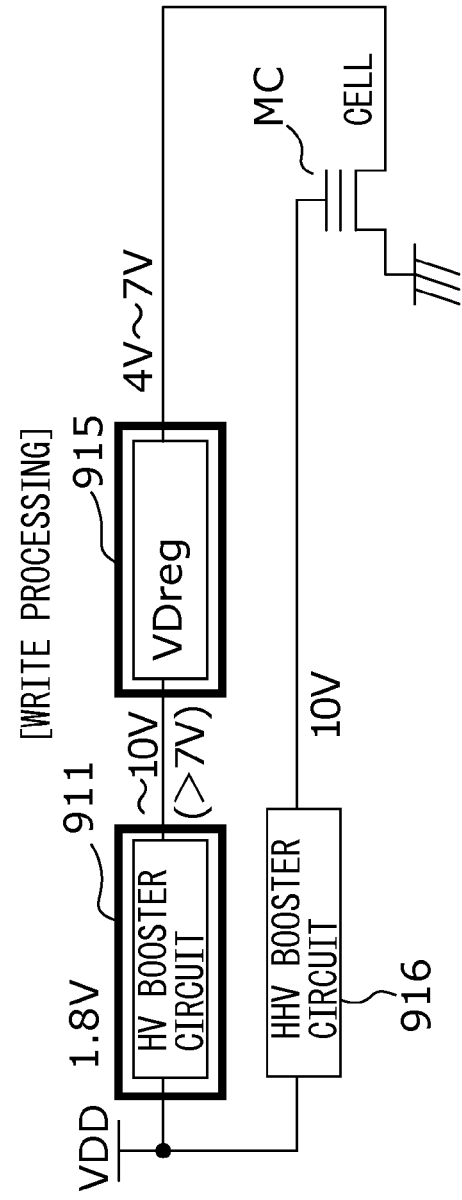
FIG. 1A
FIG. 1B

SEMICONDUCTOR INTEGRATED CIRCUIT DEVICE

CROSS REFERENCE TO RELATED APPLICATION

This application is based upon and claims the benefit of priority of the prior Japanese Patent Application No. 2010-081152, filed on Mar. 31, 2010, the entire contents of which are incorporated herein by reference.

FIELD

The embodiment discussed herein are related to a semiconductor integrated circuit device.

BACKGROUND

Recently, semiconductor integrated circuit devices have been using several different voltages obtained by boosting a power source voltage. Specifically, for example, in a semiconductor integrated circuit device mounting a flash memory, when reading and writing data in the flash memory, it is preferable to perform processing while making the gate voltages and drain voltages of the memory cells different potentials.

In a semiconductor integrated circuit device mounting a flash memory, when reading/writing data in the flash memory, several different voltages obtained by boosting the power source voltage are being used.

Here, in the semiconductor integrated circuit device, current is, for example, run to two types of regulators so as to create voltages lower than the high voltage boosted by a booster circuit.

In this regard, the regulators may continue to run current to the circuit so as to lower (adjust) the given voltage and output a predetermined voltage, but this would lead to an increase in the consumed current. Furthermore, provision of the regulators would also lead to an increase of the area occupied on the circuit.

In the past, various semiconductor integrated circuit devices have been proposed using several different voltages obtained by boosting a power source voltage (see, for example, Japanese Laid-open Patent Publication No. 2008-269727).

SUMMARY

According to an aspect of the embodiment, there is provided a semiconductor device including a booster circuit and a detector. The booster circuit is configured to boost an input voltage and output an output voltage, and the detector is configured to output the output voltage, which is output from the booster circuit, and control the booster circuit to generate a plurality of different voltages in accordance with an operating mode.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 1A and FIG. 1B are block diagrams schematically illustrating one example of a semiconductor integrated circuit device;

DESCRIPTION OF EMBODIMENTS

Figure 2:
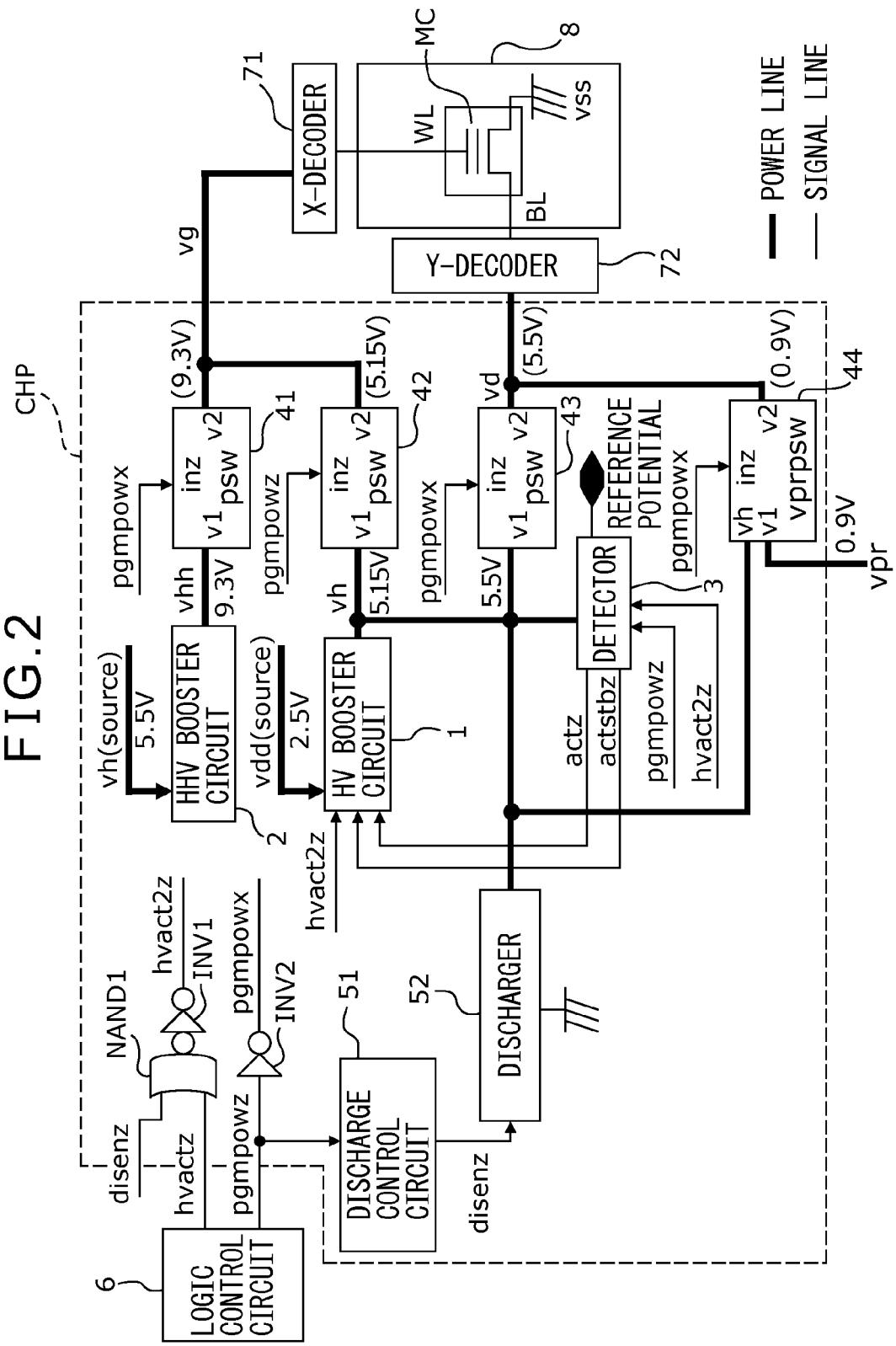
FIG. 2 is a block diagram illustrating one embodiment of a semiconductor integrated circuit device.

Before describing in detail the embodiment of a semiconductor integrated circuit device (semiconductor device), an example of a semiconductor integrated circuit device will be described with reference to FIG. 1A and FIG. 1B.

FIG. 1A and FIG. 1B are block diagrams schematically illustrating one example of a semiconductor integrated circuit device, wherein FIG. 1A illustrates the state of a power source circuit at the time of reading data from a flash memory cell MC, while FIG. 1B illustrates the state of a power source circuit at the time of writing data to a cell MC.

Reference numeral 911 indicates an HV booster circuit, 912 a regulator (VGreg) which generates a gate voltage at the time of read processing, 913 a regulator (VBLreg) which generates a bias voltage, and, further, 914 indicates a read bias transistor (Rbias).

Further, reference numeral 915 indicates a regulator (VDreg) which generates a drain voltage at the time of write processing, while 916 indicates an HHV booster circuit which generates a gate voltage at the time of write processing. Note that, MC indicates a flash memory cell.

Here, the HV booster circuit 911, for example, boosts the 1.8V power source voltage VDD to generate a 10V or so voltage (voltage higher than 7V). Further, the HHV booster circuit 916, for example, boosts the 1.8V power source voltage VDD to generate a 10V voltage.

The VGreg 912, for example, receives the 10V or so output voltage from the HV booster circuit 911 and generates a 4V voltage, while the VBLreg 913, for example, receives the 1.8V power source voltage VDD and generates a 1.3V voltage. Further, the VDreg 915, for example, receives the 10V or so output voltage from the HV booster circuit 911 and generates a 4V to 7V voltage (step voltage).

As illustrated in FIG. 1A, when reading data from a flash memory cell MC, a 4V voltage is supplied to the gate of the cell MC (word line) from the VGreg 912. Furthermore, a 1.3V bias voltage is supplied to the drain of the cell MC (bit line) through the Rbias 914 from the VBLreg 913. Here, the source of the cell MC is made the ground (0V).

Due to this, for example, connection of the source and drain of a cell MC is controlled in accordance with whether a charge has built up at the floating gate of the flash memory cell MC. Further, by the change of level of the drain of the cell MC, data which is stored in the cell MC is read out through a bit line.

Further, as illustrated in FIG. 1B, when writing data in a flash memory cell MC, the 10V voltage from the HHV booster circuit 916 is supplied to the cell MC. Furthermore, a 4V to 7V step voltage is successively applied to the drain of the cell MC from the VDreg 915 and a charge built up at the floating gate of the cell MC to write data. Here, the source of the cell MC is grounded (0V).

In actual write processing, for example, write verify processing is performed for avoiding overwrite and a suitable amount of charge is built up (trapped) at the floating gate of the cell MC. Further, a different voltage is used even in processing for erasing data of the flash memory cell MC, but this is omitted. Note that, the voltage values are simple examples. Various cases are possible needless to say.

In this way, for example, in a semiconductor integrated circuit device mounting a flash memory, when reading/writing data in the flash memory, several different voltages obtained by boosting the power source voltage are being used.

As explained above, in the semiconductor integrated circuit device of FIG. 1A and FIG. 1B, for example, a 1.8V power source voltage VDD is boosted by the HV booster circuit 911 to a 10V or so voltage (voltage higher than 7V) and is boosted by the HHV booster circuit 916 to a 10V voltage.

Further, the 10V or so voltage from the HV booster circuit 911 is lowered by the VGreg 912 to a 4V voltage and, further, is lowered by the VDreg 915 to a 4V to 7V voltage.

Note that, in the semiconductor integrated circuit device of FIG. 1A and FIG. 1B, the output voltage of the HV booster circuit 911 is lowered by the VGreg 912 at the time of read processing and is lowered by the VDreg 915 at the time of write processing. That is, the HV booster circuit 911 is shared by the read processing and the write processing.

However, in the semiconductor integrated circuit device of FIG. 1A and FIG. 1B, even if sharing the HV booster circuit 911 for the read and write processing, at the time of read processing, the VGreg 912 has to be used, while at the time of write processing, the VDreg 915 has to be used.

That is, in the semiconductor integrated circuit device of FIG. 1A and FIG. 1B, current is run to two types of regulators of the VGreg 912 and VDreg 915 so as to create voltages lower than the high voltage boosted by the HV booster circuit 911.

In this regard, the regulators may continue to run current to the circuit so as to lower (adjust) the given voltage and output a predetermined voltage, but this would lead to an increase in the consumed current. Furthermore, provision of the regulators would also lead to an increase of the area occupied on the circuit.

In this regard, in the past, various semiconductor integrated circuit devices have been proposed using several different voltages obtained by boosting a power source voltage.

Below, an embodiment of a semiconductor integrated circuit device (semiconductor device) will be explained in detail with reference to the attached drawings. FIG. 2 is a block diagram illustrating one embodiment of a semiconductor integrated circuit device. It illustrates an example of a semiconductor integrated circuit device including a flash memory (flash memory core, flash macro memory). Note that, the flash memory may also be a memory other than a flash memory.

In FIG. 2, reference numeral 1 indicates an HV booster circuit, 2 an HHV booster circuit, 3 a detector, 41 to 43 switch circuits (psw), 44 a switch circuit (vprpsw), 51a discharge control circuit, 52 a discharger, and, further, 6 a logic control circuit. Note that, vprpsw (44) indicates a bit line precharge-use switch circuit for the time of a read operation.

Further, reference numeral 71 indicates an X-decoder (row decoder), 72 indicates a Y-decoder (column decoder), 8 indicates a memory cell array, CHP indicates a boosted power unit, NAND1 indicates a NAND gate, INV1 and INV2 indicate inverters, and, further, MC indicates a flash memory cell.

As illustrated in FIG. 2, the HV booster circuit 1 is supplied with a 2.5V power source voltage vdd and, as explained later, outputs a 5.5V output voltage vh at the time of a data write operation to the cell MC (data write mode). Further, at the time of a data read operation from the cell MC (data read mode), it outputs a 5.15V output voltage vh.

Further, the HHV booster circuit 2 is supplied with a 5.5V voltage vh (output voltage of HV booster circuit 1 at time of data write operation) and outputs a 9.3V output voltage vhh to the cell MC at the time of a data write operation.

The switch circuit 42 is controlled by a program run signal pgmpowz ("H"=run). Further, the switch circuits 41, 43, and 44 are controlled by the signal pgmpowx comprised of the program run signal pgmpowz which is inverted by the inverter INV2.

Note that, as clear from the later explained FIG. 10, the switch circuits 41 to 43 are designed so that when the signal pgmpowz or pgmpowx which is input to the terminal inz is "L", the terminals V1 and V2 are connected.

Further, as clear from the later explained FIG. 11, the switch circuit 44 is designed so that when the signal pgmpowx which is input to the terminal inz is "H", the terminals V1 and V2 are connected.

That is, at the time of a data write operation to the cell MC (at the time of running a program), the signal pgmpowx becomes "L", so a 9.3V output voltage vhh from the HHV booster circuit 2 is supplied through the switch circuit 41 as a gate voltage vg to the X-decoder 71.

Furthermore, when running the program, the 5.5V output voltage vh from the HV booster circuit 1 is supplied through the switch circuit 43 as the drain voltage vd to the Y-decoder 72. Here, the gate voltage vg becomes the applied voltage of the word line WL which is connected to the gate of the cell MC. Further, the drain voltage vd becomes the applied voltage of the bit line BL which is connected to the drain of the cell MC.

On the other hand, when reading data from the cell MC, the signal pgmpowz becomes "L", so the 5.15V output voltage vh from the HV booster circuit 1 is supplied through the switch circuit 42 as the gate voltage vg to the X-decoder 71.

Furthermore, a 0.9V voltage is supplied through the switch circuit 44 as the drain voltage vd to the Y-decoder 72. Note that, the 0.9V voltage vpr which is supplied to the switch circuit 44 is, for example, supplied from outside of the flash macro memory.

Note that, the voltage values at the time of the above-mentioned data write operation to the flash memory cell MC and at the time of a data read operation from the cell MC are just examples. Other values are also possible. Further, in FIG. 2, the source of the cell MC is directly connected to the ground (vss), but as explained later with reference to FIG. 5, it is connected through the resistor connection selection circuit 80.

Figure 12:
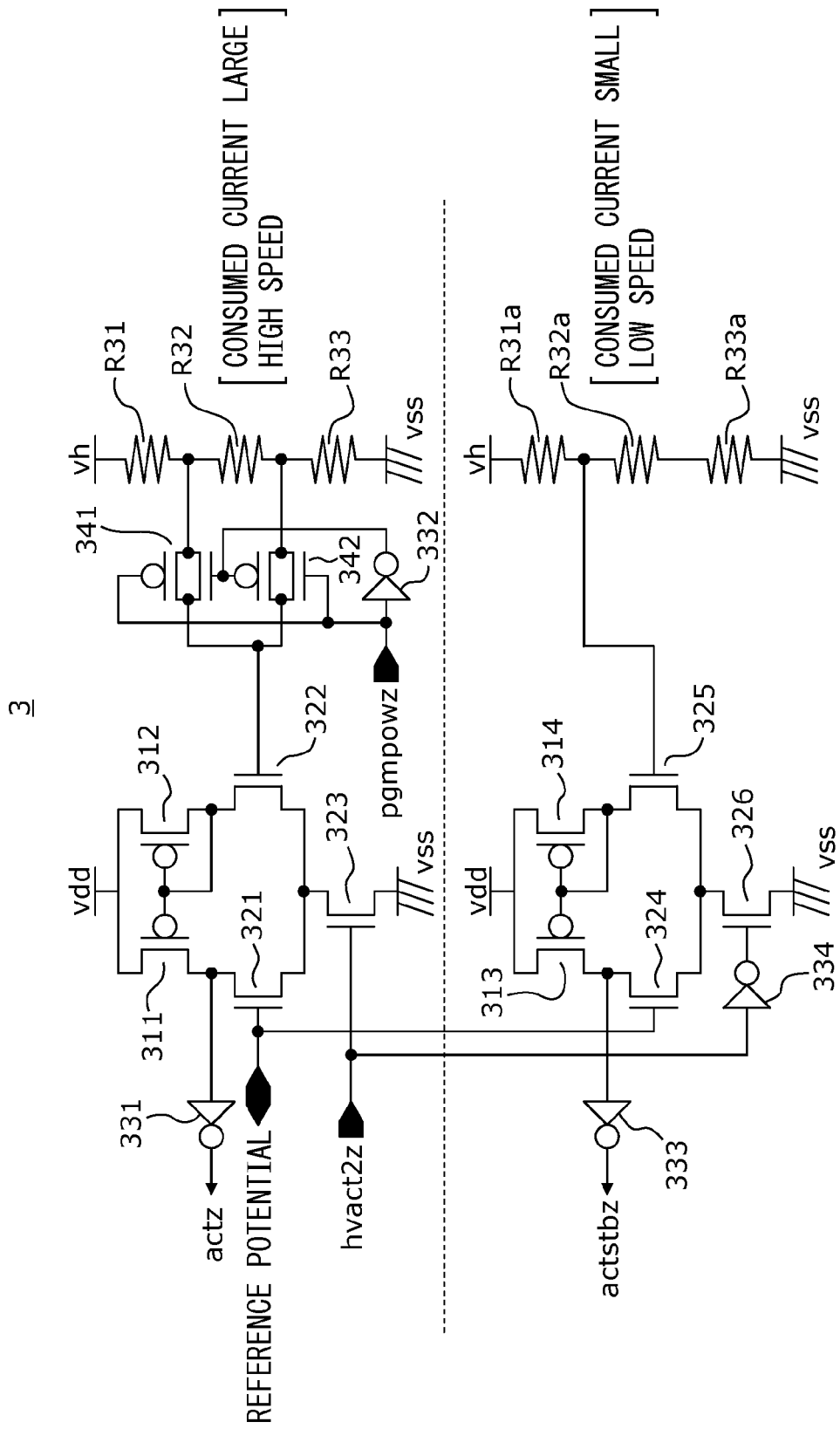
FIG. 12 is a view illustrating one example of a detector in FIG. 2.

The detector 3, as explained in detail later with reference to FIG. 12, compares the output voltage vh of the HV booster circuit 1 with a reference potential (resistance-divided potential) and controls the HV booster circuit 1. Here, the detector 3 is supplied with a program execution signal pgmpowz and an enable signal hvact2z of the HV booster circuit 1 ("H"=enable (generate voltage)).

Further, the HV booster circuit 1 is supplied with a high speed oscillator-use signal actz ("H"=use high speed oscillator to drive HV booster circuit 1) and a low speed oscillator-use signal actstbz ("H"=use low speed oscillator to drive HV booster circuit 1) from the detector 3. Note that, the HV booster circuit 1 is also supplied with an enable signal hvact2z of the HV booster circuit 1.

That is, in the present embodiment, without using any regulators, the detector 3 monitors the output voltage vh of the HV booster circuit 1 and controls the pump (charge pump) of the HV booster circuit 1 to be driven/and be stopped so as to output a predetermined voltage.

Here, the signal hvact2z is a signal obtained by inputting an enable request signal hvactaz and a discharge enable signal disenz of the HV booster circuit 1 from the logic control circuit 6 to a NAND gate NAND1 and inverting the output of the NAND gate NAND1 at the inverter INV2. Note that, the discharge enable signal disenz is a signal which is output from the discharge control circuit 51.

The discharge control circuit 51 receives a program execution signal pgmpowz and supplies a discharge enable signal disenz to a discharger 52.

The discharger 52 is connected to the internal power source line to which the output voltage vh of the HV booster circuit 1 is supplied. When the output voltage vh of the HV booster circuit 1 is switched from 5.5V to 5.15V, the excess load is discharged from the internal power source line to instantaneously make the voltage 5.15V.

Figure 3:
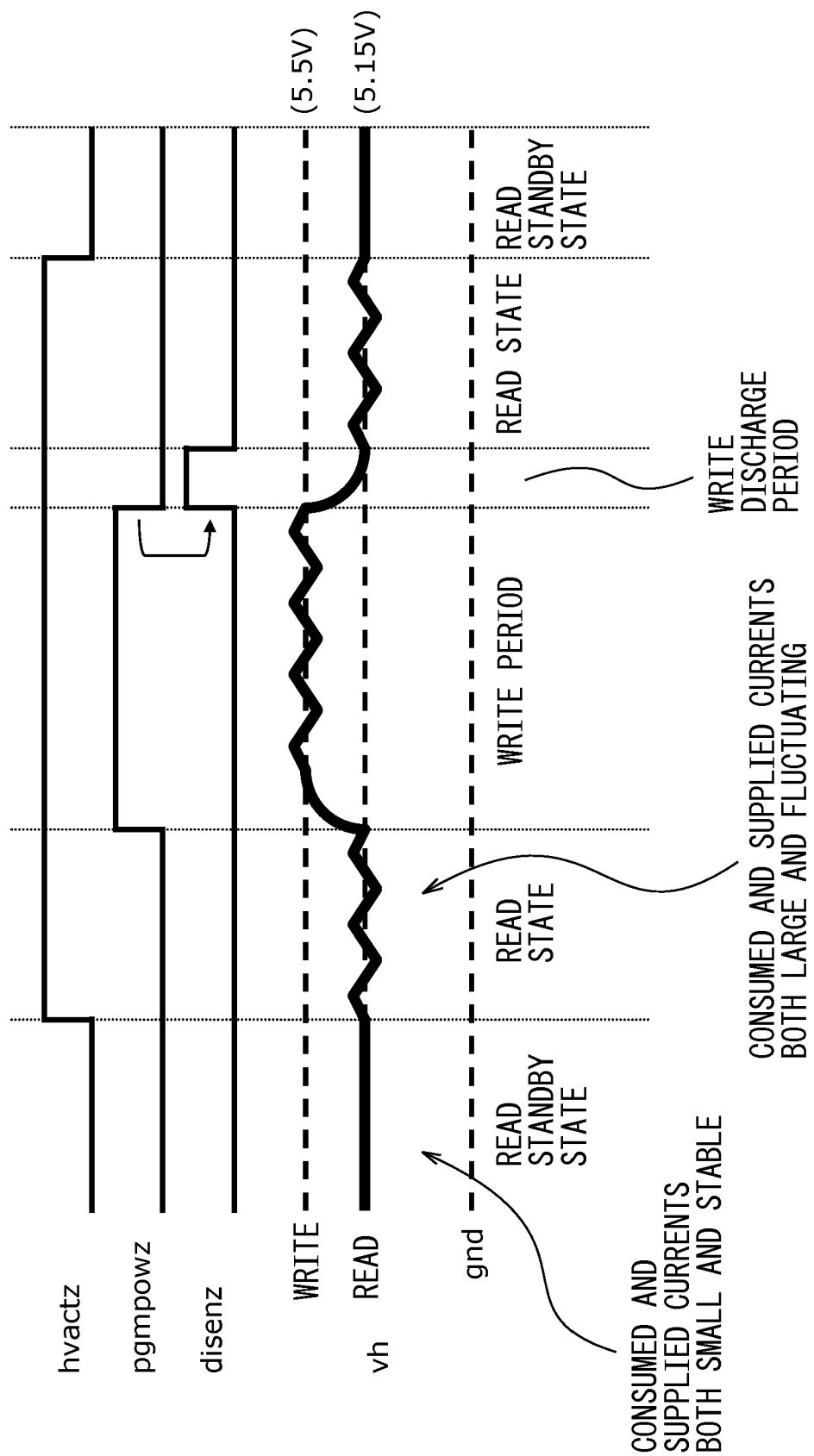
FIG. 3 is a view for explaining the operation of a semiconductor integrated circuit device of FIG. 2.

FIG. 3 is a view for explaining the operation of a semiconductor integrated circuit device of FIG. 2. First, in the read standby state, the consumed and supplied currents (power) are both small and stable. At this time, the output voltage vh of the HV booster circuit 1 becomes, for example, 5.15V. Further, as explained later, a low speed oscillator is used.

Next, when the signal hvactz changes from a low level "L" to a high level "H" and the read state is entered, the output voltage vh of the HV booster circuit 1 is 5.15V, but the consumed and supplied currents are both large and fluctuate.

Furthermore, when the program run signal pgmpowz changes from "L" to "H" and the write period is entered, the output voltage vh of the HV booster circuit 1 rises to 5.5V and, further, the consumed and supplied currents are both large and fluctuate.

Here, for example, in the read state and write period, if the consumed current becomes large, the high speed oscillator-use signal actz is made "H" and the high speed oscillator is used to drive the HV booster circuit 1.

Next, when the program execution signal pgmpowz changes from "H" to "L" and ends the write period, a one-shot pulse discharge enable signal disenz is output. During the write discharge period, the 5.5V output voltage vh is instantaneously lowered to 5.15V.

Here, during the write discharge period, for example, it is possible to continuously output a signal indicating the write period to the outside of the flash macro memory and not perform a read operation even if there is a read request.

Further, after the above readout stage, if the signal hvactz changes from "H" to "L" and the read standby state is entered, the consumed and supplied current are both small and stable at 5.15V.

Figure 4:
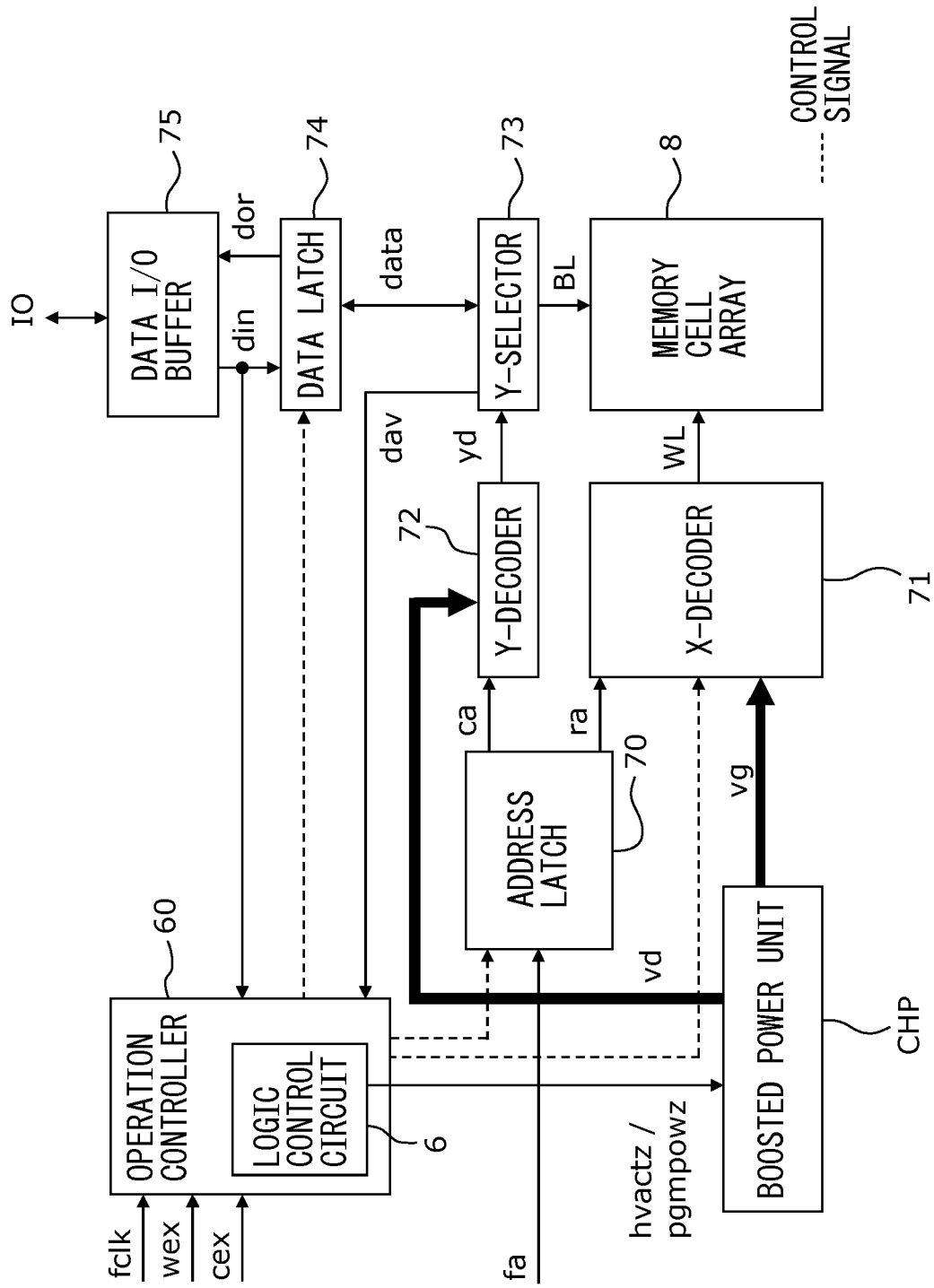
FIG. 4 is a block diagram of the semiconductor integrated circuit device of FIG. 2 drawn from a different perspective.

FIG. 4 is a block diagram of a semiconductor integrated circuit device of FIG. 2 which is drawn from a different perspective. In FIG. 4, reference numeral 60 indicates an operation controller, 70 an address latch, 73 a Y-selector, 74 a data latch, and, further, 75 a data input/output buffer.

As illustrated in FIG. 4, the logic control circuit 6 forms part of the operation controller 60. The operation controller 60 receives a user-use flash macro memory-use clock fclk, a user-use write command enable signal wex, and a user-use command enable signal and supplies the booster power source CHP with the above-mentioned signals hvactz, pgmpowz, etc.

The operation controller 60 is supplied by the data input/output buffer 75 with the user-use write data input din and by the Y-selector 73 with the internal verify-use read data day. Note that, the operation controller 60 also supplies the address latch 70, X-decoder 71, and data latch 74 with various signals, but these include little relevance, so explanations will be omitted.

The address latch 70 receives a user-use address fa, supplies the X-decoder 71 with the internal row-use address ra, and, further, supplies the Y-decoder 72 with the internal column-use address ca.

The Y-decoder 72 supplies the Y-selector 73 with an internal Y-select-use signal yd. Further, the Y-selector 73 transfers internal write/read data with a data latch 74. Here, the internal Y-select-use signal yd is a signal including a potential of the drain voltage vd.

The data input/output buffer 75 supplies the above-mentioned user-use write data input din to the operation controller 60 and the data latch 74 and receives user-use read data from the data latch 74. Further, the data input/output buffer 75 transfers write/read data with the input/output port IO.

Figure 5:
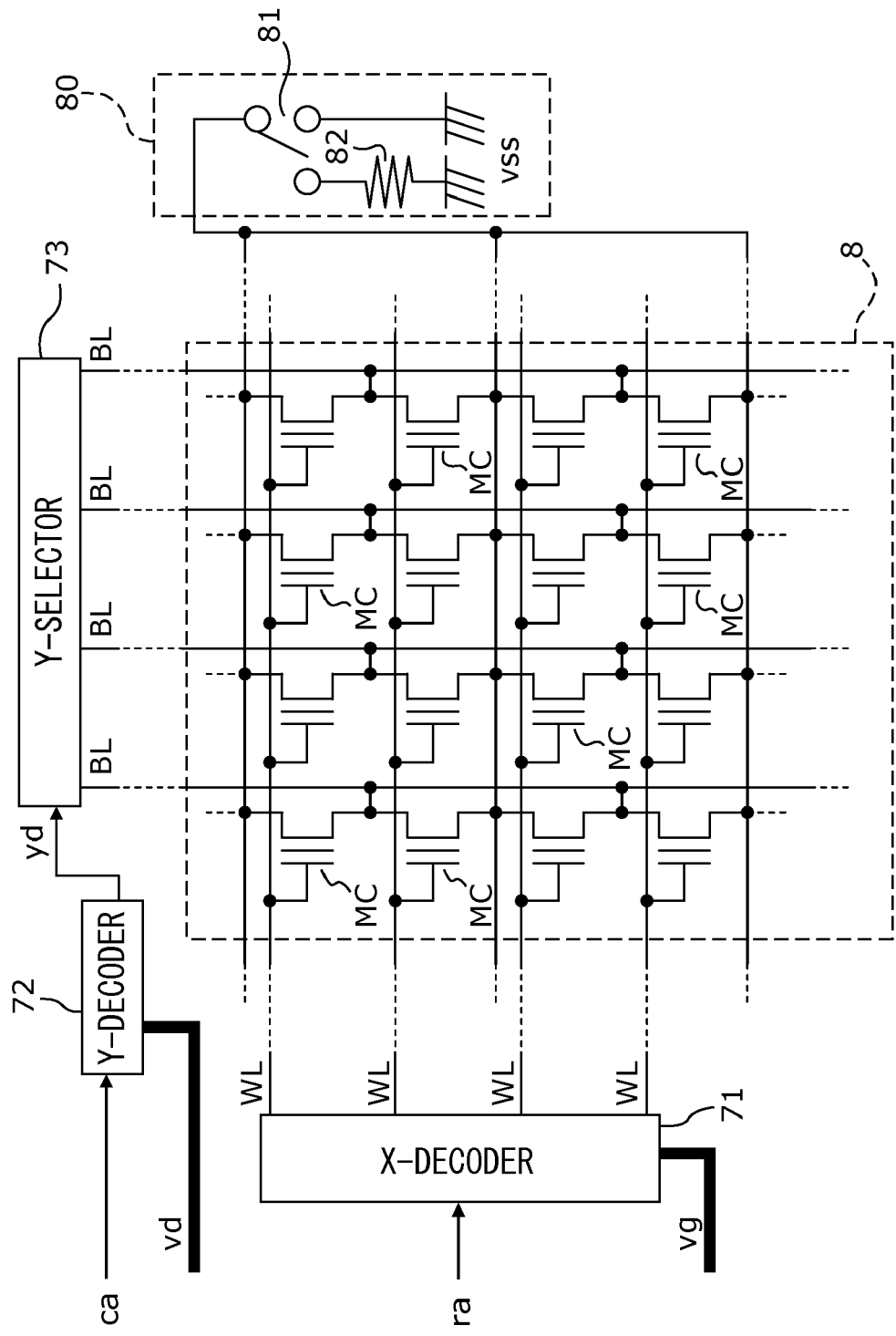
FIG. 5 is a view illustrating one example of a memory cell array in FIG. 2.

FIG. 5 is a view illustrating one example of the memory cell array in FIG. 2. In FIG. 5, reference numeral 80 indicators a resistor connection selection circuit.

As illustrated in FIG. 5, the memory cell array 8 has a plurality of flash memory cells MC arranged in a matrix. The gates of the cells MC are connected to the X-decoder 71 through word lines WL arranged in the row direction. Further, the drains of the cells MC are connected to the Y-selector 73 through bit lines BL arranged in the column direction.

Furthermore, the sources of the cells MC are all arranged together and connected to the resistor connection selection circuit 80. The resistor connection selection circuit 80 has a switch 81 and resistor 82. Further, the switch 81 is operated to connect the sources of the cells MC directly to the ground vss when writing data (when running a program) and to connect the sources of the cells MC through the resistor 83 to the ground vss when reading data.

In FIG. 5, the relationship between the gate voltage vg and drain voltage vd explained with reference to FIG. 2 and the internal row-use address ra and internal column-use address ca explained with reference to FIG. 4 is drawn to become clear.

That is, the X-decoder 71 receives the gate voltage vg and internal row-use address ra and supplies the word line WL corresponding to the address ra with a signal of the voltage vg. Further, the Y-decoder 72 receives a drain voltage vd and internal column-use address ca and supplies an internal Y-select-use signal yd of the voltage vd to the Y-selector 73. Further, the Y-selector 73 supplies the signal yd to the selected bit line BL.

Due to this, data is written in and read out at any cell MC in the memory cell array 8.

Figure 6:
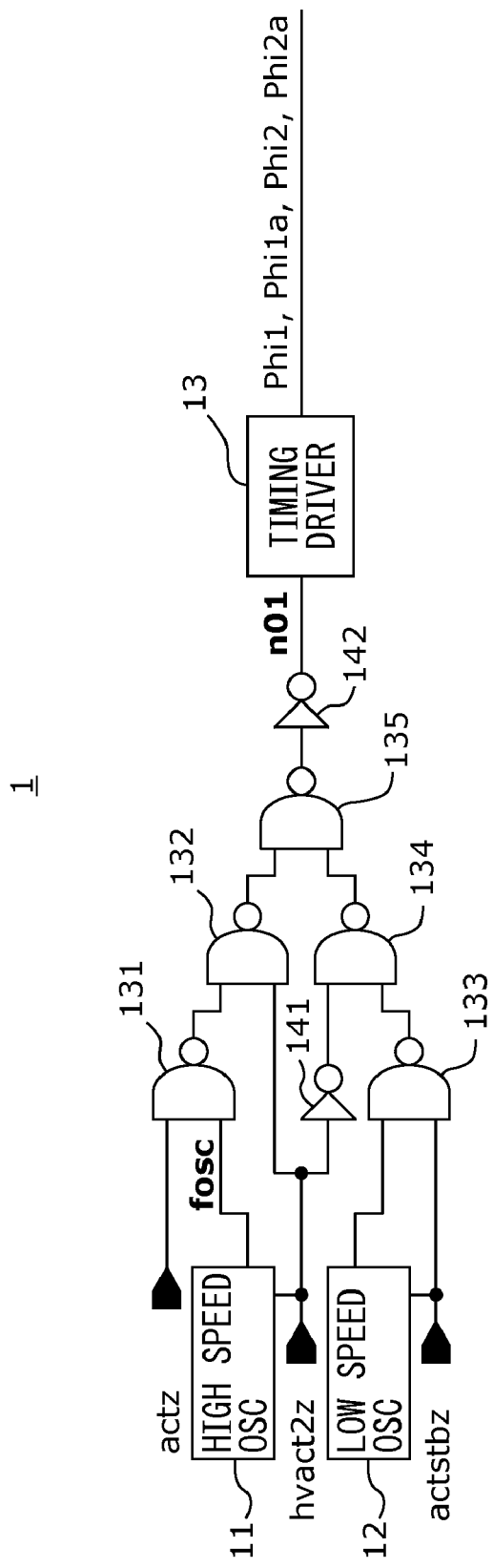
FIG. 6 is a view illustrating one example of an HV booster circuit in FIG. 2 (part 1)
Figure 7:
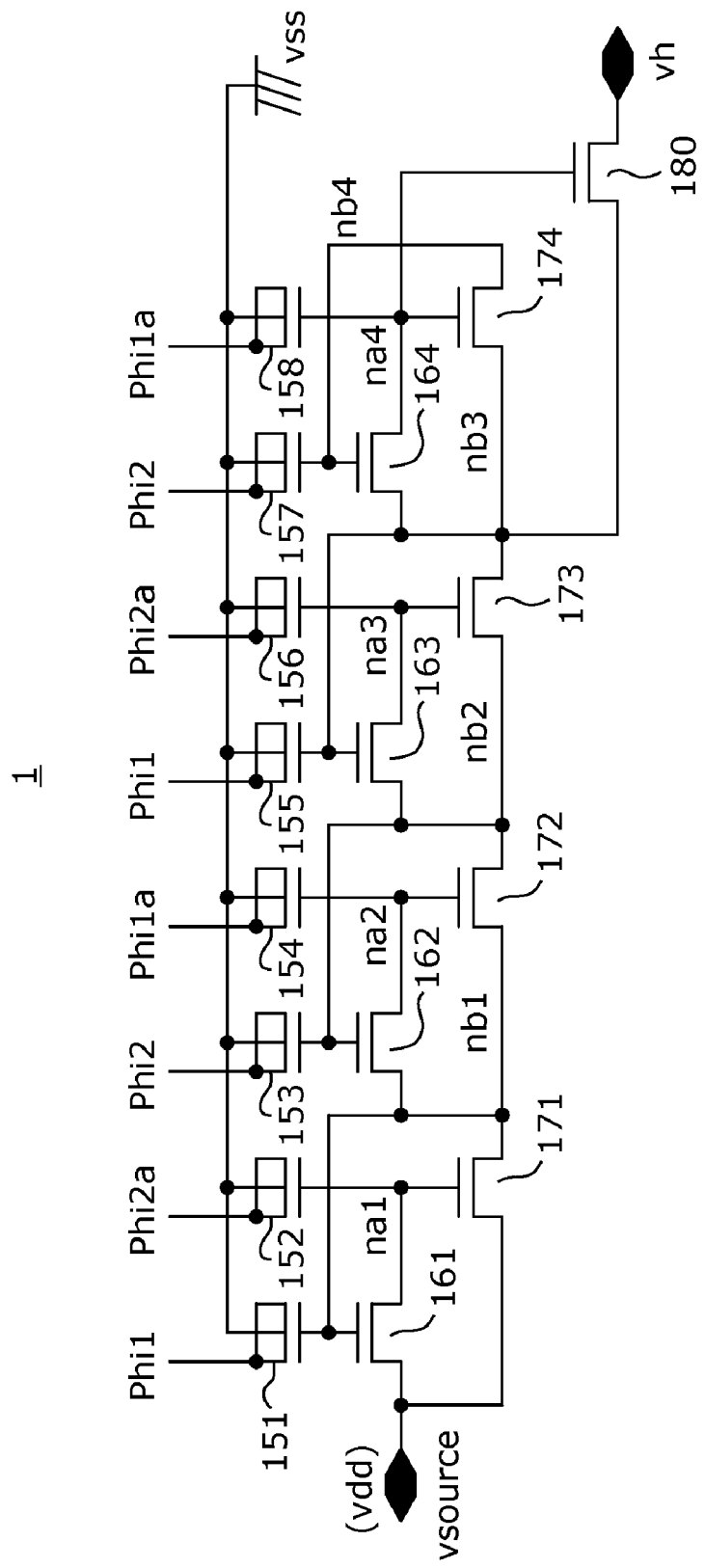
FIG. 7 is a view illustrating one example of an HV booster circuit in FIG. 2 (part 2)

FIG. 6 and FIG. 7 are views illustrating one example of the HV booster circuit in FIG. 2. Here, FIG. 6 illustrates a circuit which generates the signals Phi1, Phi1$a$, Phi2, and Phi2$a$. Further, FIG. 7 illustrates a circuit which generates a drain voltage vd from the power source voltage vdd by the generated signals Phi1, Phi1$a$, Phi2, and Phi2$a$.

In FIG. 6, reference numeral 11 indicates a high speed oscillator (high speed OSC), 12 a low speed oscillator (low speed OSC), 13 a timing driver, 131 to 135 and NAND gates, and further, 141 and 142 inverters.

Further, in FIG. 7, reference numerals 151 to 158 denote MOS capacitors (nMOS transistors). Furthermore, 161 to 164, 171 to 174, and 180 indicate MOS switches (nMOS transistors).

Note that, in FIG. 6 and FIG. 7, n01, na1 to na4, and nb1 to nb4 indicate nodes of the circuit, while fosc indicates an output clock of the high speed oscillator 11. Here, the low speed oscillator 12 is, for example, used in the above-mentioned read standby state of FIG. 3. Further, the high speed oscillator 11 is used when the consumption current becomes larger in the read state and write period of FIG. 3.

Figure 8:
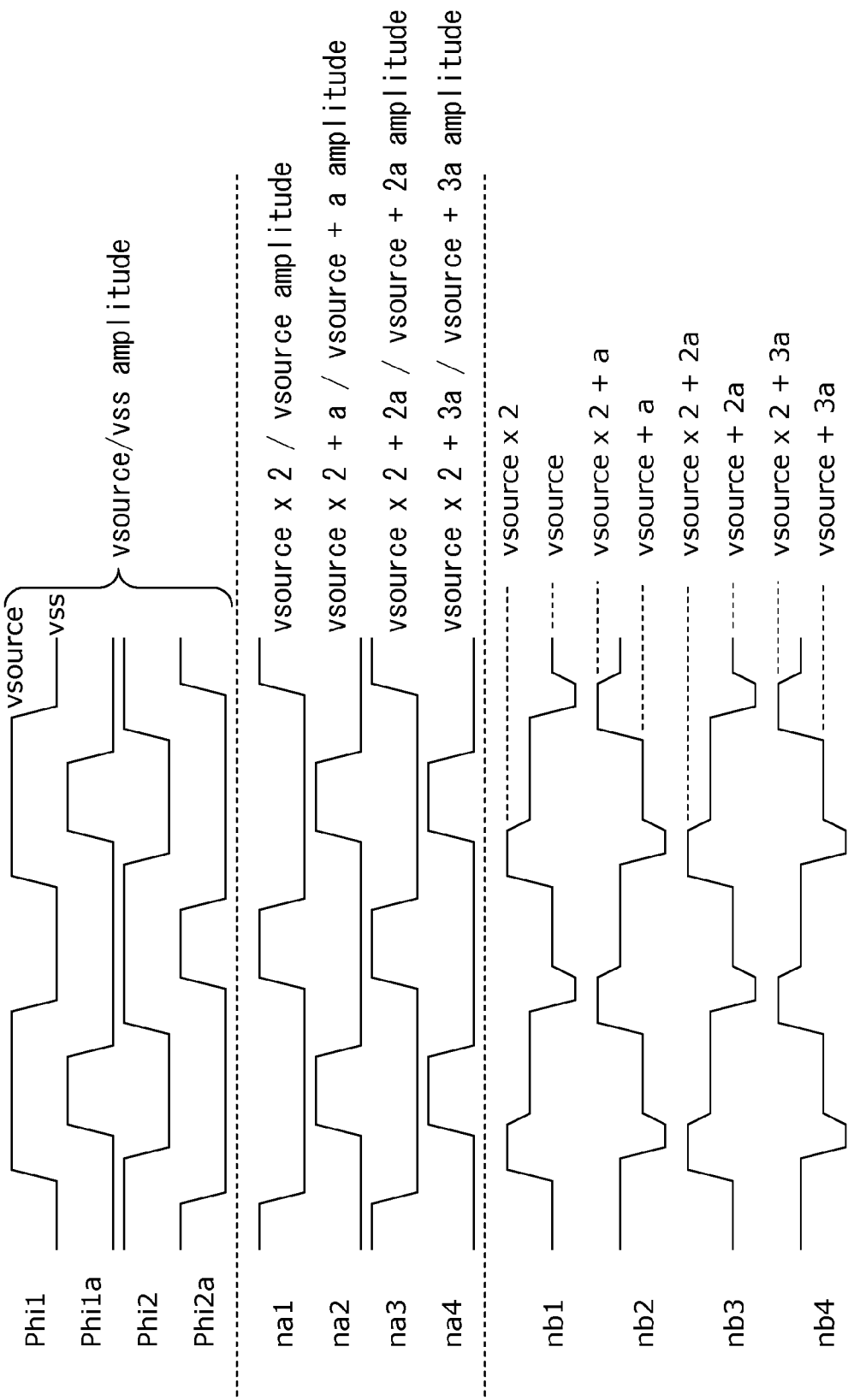
FIG. 8 is a view for explaining the operation of the HV booster circuit of FIG. 6 and FIG. 7 (part 1)
Figure 9:
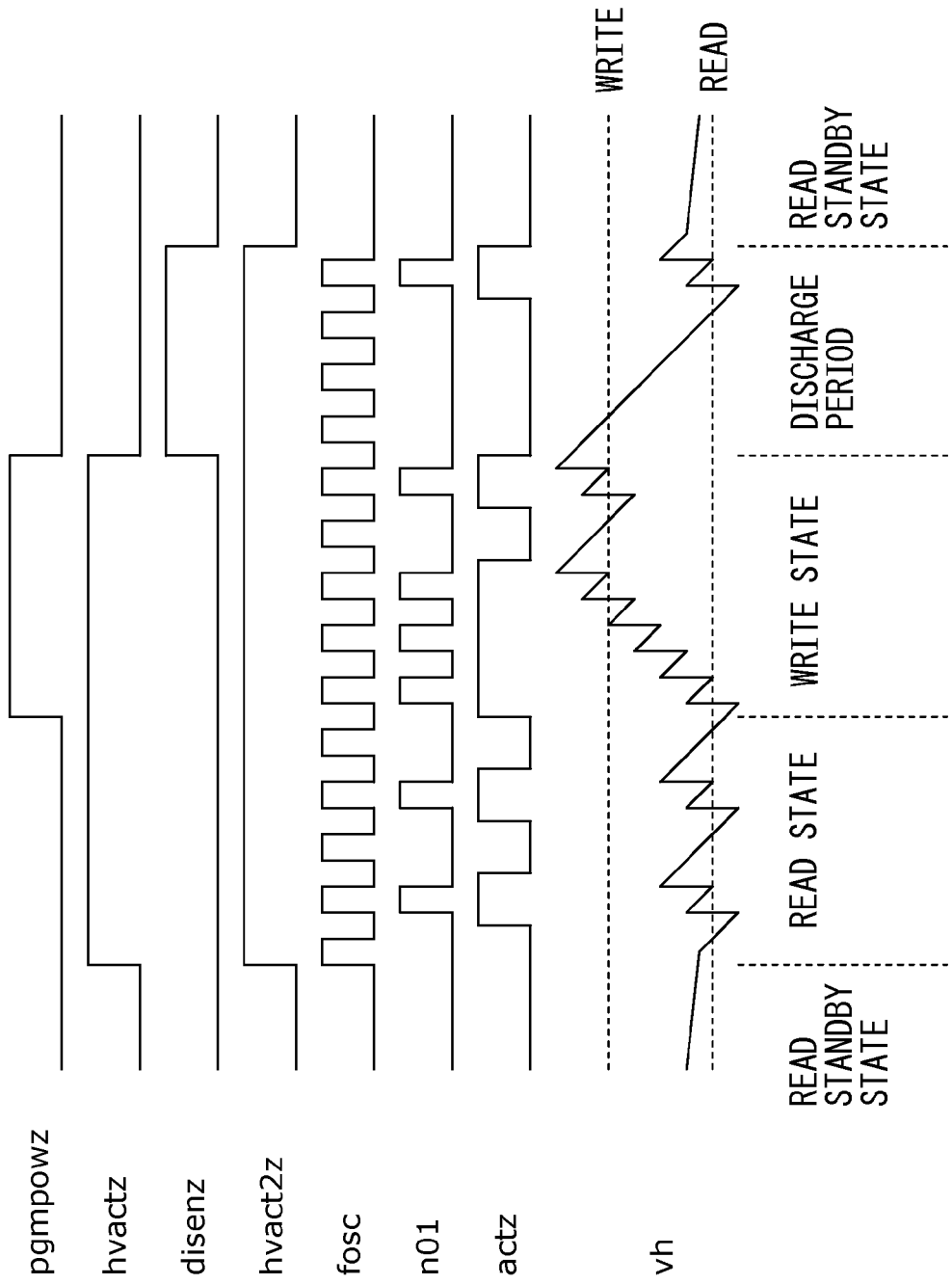
FIG. 9 is a view for explaining the operation of the HV booster circuit of FIG. 6 and FIG. 7 (part 2)

FIG. 8 and FIG. 9 are views for explaining the operation of the HV booster circuit of FIG. 6 and FIG. 7. Here, FIG. 8 is a view illustrating the waveforms of the signals Phi1, Phi1a, Phi2, and Phi2a and the nodes na1 to na4 and nb1 to nb4 of the circuit of FIG. 7.

Further, FIG. 9 is a view illustrating the waveforms of the signals actz, hvact2z, fosc, and node n01 in the circuit of FIG. 6 together with the waveforms of the signals pgmpowz, hvactz, disenz, and output voltage hv.

First, from FIG. 8, it is learned that the input voltage vsource is successively boosted at the nodes na1 to na4 and nb1 to nb4 by the amplitude vsource/vss signals Phi1, Phi1a, Phi2, and Phi2a. Here, the reference notation "a" denotes the voltage (amplitude) built up by the MOS capacitors 151 to 158.

Next, as illustrated in FIG. 9, first, at the read standby state, the consumed and supplied currents are small, so the low speed oscillator 12 is used and the output voltage vh of the HV booster circuit 1 is also stable.

Next, at the read state, the enable request signal hvactz from the logic control circuit 6 changes from "L" to "H", while the enable signal hvact2z of the HV booster circuit 1 changes from "L" to "H". Furthermore, in the write period where the consumed and supplied currents become large (write state), the program execution signal pgmpowz changes from "L" to "H".

Further, when the high speed oscillator-use signal actz changes from "L" to "H", the output clock fosc of the high speed oscillator 11 is transmitted to the node n01. That is, the timing driver 13 operates in accordance with the high speed clock (fosc) for exactly the period where the consumed and supplied currents become large.

Furthermore, when the program execution signal pgmpowz changes from "H" to "L" and the write period ends, a one-shot pulse discharge enable signal disenz is output and a discharge state is entered, then the read standby state is again returned to.

In this way, when, for example, changing from the read standby state→read state→write state→discharge state→read standby state, the output voltage vh of the HV booster circuit 1 changes as illustrated by FIG. 9.

Figure 10:
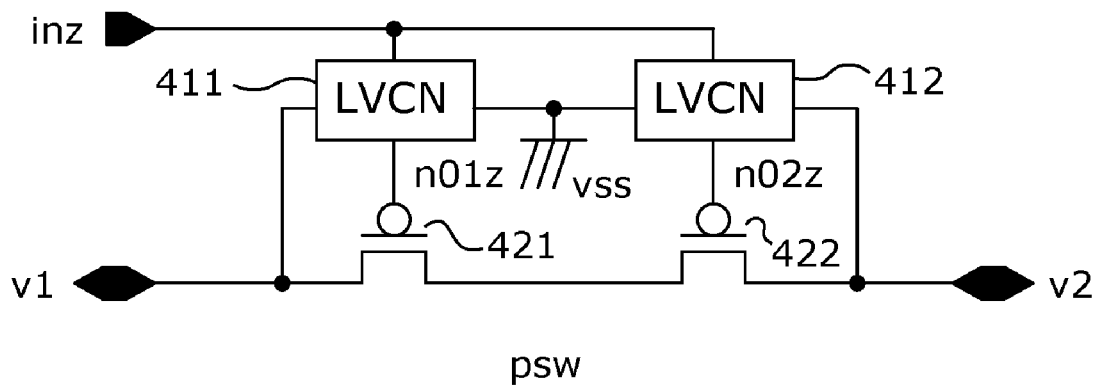
FIG. 10 is a view illustrating one example of a switch circuit (psw) in FIG. 2.

FIG. 10 is a view illustrating an example of the switch circuit (psw) in FIG. 2 and illustrates the switch circuits 41 to 43.

As illustrated in FIG. 10, the switch circuit (42, 43) has level encoders (LVCN) 411 and 422 and pMOS transistor 421 and 422.

In the switch circuit 41, when the signal of the terminal inz is "H", the transistors 421 and 422 turn off and terminals v1 and v2 are cut off, while conversely when the signal of the terminal inz is "L", the transistors 421 and 422 turn on and the terminals v1 and v2 are connected.

Here, the switch circuit 41 is provided with the level encoders 411 and 422 and pMOS transistors 421 and 422 because, for example, when switching from the write state to the read state etc., the voltage of the terminal v2 sometimes becomes higher than the voltage of the terminal v1.

That is, the switch circuit 41 of FIG. 10 is designed to enable switching regardless of the relative magnitudes of the voltages of the terminals v1 and v2. Note that, the circuit of FIG. 10 is just one example. Various circuits may be used needless to say.

Figure 11:
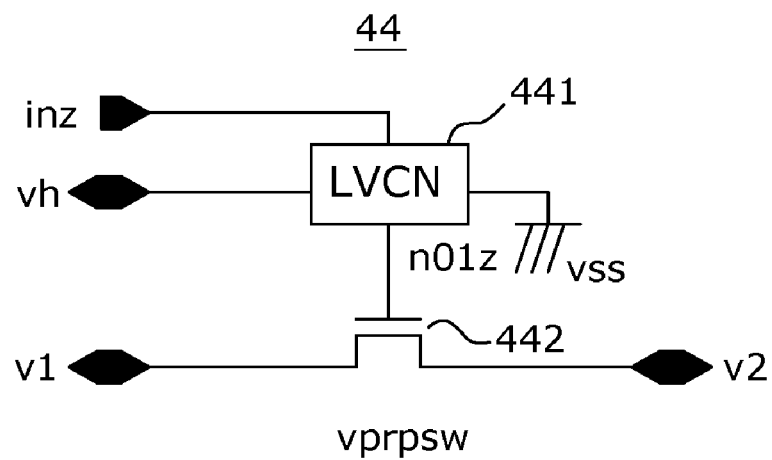
FIG. 11 is a view illustrating one example of a switch circuit (vprpsw) in FIG. 2.

FIG. 11 is a view illustrating a switch circuit (vprpsw) in FIG. 2. As illustrated in FIG. 11, the switch circuit 44 has a level encoder (LVCN) 441 and nMOS transistor 442.

In the switch circuit 44, when the signal of the terminal inz is "H", the transistor 442 turns on and the terminals v1 and v2 are connected, while conversely when the signal of the terminal inz is "L", the transistor 442 turns off and the terminals v1 and v2 are cut off.

Here, the switch circuit 44 may also have just the single level encoder 441 and single nMOS transistor 442 rather than the two level encoders 411 and 422 and two pMOS transistors 421 and 422 like the above-mentioned switch circuit 41.

This is because at the time of reading data, the voltage vpr which is supplied to the terminal v1 is, for example, 0.9V, or sufficiently lower than the voltage vh (5.15V), and exceeds the voltage vh and vd.

That is, the switch circuit 44 is designed to enable reliable switching of the nMOS transistor 442 by the voltage vh through the level encoder 441. Note that, the circuit of FIG. 11 is also just one example. Various types may be used.

FIG. 12 is a view illustrating one example of the detector in FIG. 2 and illustrates the circuit for generating the high speed oscillator-use signal actz and low speed oscillator-use signal actstbz in the circuit of the above-mentioned FIG. 6.

As illustrated in FIG. 12, the detector 3 has pMOS transistors 311 to 314, nMOS transistors 321 to 326, inverters 331 to 334, CMOS transfer gates 341 and 342, and resistors R31 to R33 and R31a to R33a.

The comparator comprised of the transistors 311, 312, and 321 to 323 compares the reference potential supplied to the gate of the transistor 321 and the gate potential of the transistor 322 and, when the reference potential is higher, outputs an "H" high speed oscillator-use signal actz.

Here, the gate of the transistor 322 is given a signal obtained by dividing the output voltage vh of the HV booster circuit 1 by the resistors R31 to R33 through the transfer gates 341 and 342 controlled by the program execution signal pgmpowz. Note that the set voltage generator includes the resistors R31 to 33, inverter 332, and transfer gates 341 and 342.

That is, at the time of writing data where the program run signal pgmpowz becomes "H", a signal of a low voltage level from the connection node of the resistors R32 and R33 is supplied to the gate of the transistor 322.

Further, when the program execution signal pgmpowz is "L", a signal of a high voltage level from the connection node of the resistors R31 and R32 is supplied to the gate of the transistor 322. Note that, the gate of the transistor 323 is supplied with the enable signal hvact2z of the HV booster circuit 1.

When the signal hvact2z is "H" and the signal pgmpowz is "H", the reference potential and the signal of a low voltage level are compared. For example, the signal actz is made "H" and a boosting operation of the HV booster circuit by the high speed oscillator 11 is performed so that the output voltage vh becomes 5.5V.

That is, the HV booster circuit 1 uses a comparator to compare a fixed reference potential and a signal of the low voltage level and is controlled so that the output voltage vh of the HV booster circuit 1 becomes a high target voltage (5.5V higher than 5.15V).

Further, when the signal hvact2z is "H" and the signal pgmpowz is "L", the reference potential and the signal of a high voltage level are compared. For example, a boosting operation of the HV booster circuit by the high speed oscillator 11 is performed so that the output voltage vh becomes 5.15V.

That is, the HV booster circuit 1 uses a comparator to compare a fixed reference potential and high voltage level signal and is controlled so that the output voltage vh of the HV booster circuit 1 becomes a low target voltage (5.15V lower than 5.5V).

In this way, the detector 3 changes the ratio of resistance division by the resistors R1 to R3 at the set voltage generator in accordance with the operating mode (signal pgmpowz) and generates a different set voltage (5.15V and 5.5V). Further, this generated set voltage is compared by a comparator with the reference potential. In accordance with the results (due to the signal actz), a boosting operation of the HV booster circuit 1 by the high speed oscillator 11 is controlled.

Next, a comparator comprised of the transistors 313, 314, and 324 to 326 compares the reference potential of the gate of the transistor 324 and the gate potential of the transistor 325 and outputs an "H" low speed oscillator-use signal actstbz when the reference potential is high.

Here, the gate of the transistor 325 is given a signal obtained by dividing the output voltage vh of the HV booster circuit 1 by the resistors R31a to R33a. Further, the resistors R31a to R33a are made resistance values similar to the resistors R31 to R33. A signal of a high voltage level from the connection node of the resistors R31a and R32a is supplied to the gate of the transistor 325. Note that, the gate of the transistor 326 is supplied with a signal obtained by inverting the enable signal hvact2z of the HV booster circuit 1 by the inverter 334.

Due to this, when the signal hvact2z is "L", the reference potential and the signal of the high voltage level are compared. For example, a boosting operation of the HV booster circuit 1 by the low speed oscillator 12 is performed so that the output voltage vh becomes 5.15V.

Therefore, the detector 3 makes the HV booster circuit 1 perform the optimal boosting operation in accordance with the relative magnitude of the preferable output voltage vh (5.15V or 5.5V) and the consumed current (power).

Figure 13:
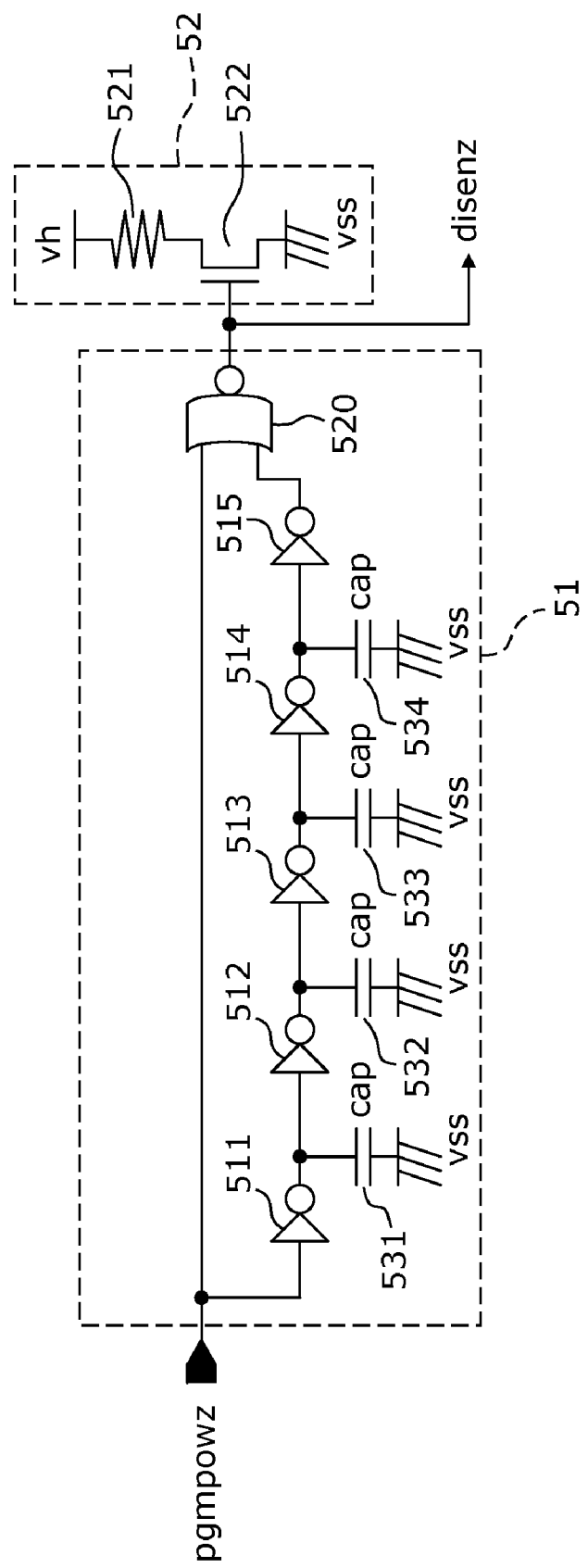
FIG. 13 is a view illustrating one example of a discharge control circuit and discharger in FIG. 2.

FIG. 13 is a view illustrating one example of a discharge control circuit and discharger in FIG. 2. Here, the discharge controller includes a discharge control circuit 51 and discharger 52.

As illustrated in FIG. 13, the discharge control circuit 51 has inverters 511 to 515, a NAND gate 520, and capacitors 531 to 534 and outputs a signal disenz having a predetermined pulse width after the signal pgmpowz changes from "H" to "L". Note that, the pulse width of the discharge enable signal disenz is defined by the capacities of the capacitors 531 to 534 provided at the outputs of the inverters 511 to 514.

The discharger 52 has a resistor 521 and nMOS transistor (switch) 522 and connects the output voltage vh of the HV booster circuit 1 to the ground vss through the resistor 521 for exactly a short time in accordance with the one-shot pulse of the discharge enable signal disenz.

Due to this, for example, the previously 5.5V output voltage vh of the HV booster circuit 1 in the write period was instantaneously lowered to about 5.15V in the one shot pulse write discharge period, then a data read operation was enabled.

Note that, during the write discharge period, for example, it is also possible to continuously output a signal to the outside of the flash macro memory indicating the write period and not perform a read operation even if there is a read request as explained above.

In this way, the semiconductor integrated circuit device of the present embodiment does not have to use regulators to lower the voltage obtained by once using a booster circuit to boost the drain voltage or gate voltage which is used, for example, for the write processing or read processing of the flash memory. As a result, it is possible to reduce the waste of the consumed power caused at the regulators reducing the voltage. Furthermore, it becomes possible to reduce the increase in the area of the circuit occupied by the regulators.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
    a booster circuit configured to boost an input voltage and output an output voltage; and
    a detector configured to output the output voltage, which is output from the booster circuit, and control the booster circuit to generate a plurality of different voltages in accordance with an operating mode.

2. The semiconductor device as claimed in claim 1, wherein
    the detector includes a comparator configured to compare a set voltage, which is generated from the output voltage and is prescribed in accordance with the operating mode with a reference potential, and use an output signal of the comparator to control the booster circuit.

3. The semiconductor device as claimed in claim 2, wherein
    the detector includes a set voltage generator configured to divide the output voltage by resistance division and generate different set voltages prescribed in accordance with the operating mode, the set voltage generator changing a ratio of the resistance division in accordance with the operating mode to generate the different set voltages.

4. The semiconductor device as claimed in claim 3, wherein
    the booster circuit selectively outputs a first booster voltage of a first potential and a second booster voltage of a second potential lower than the first potential in accordance with the different set voltages.

5. The semiconductor device as claimed in claim 4, the semiconductor device further comprising:
    a discharge controller configured to be connected to an internal power source line to which an output voltage of the booster circuit is supplied and make the internal power source line to discharge when the output voltage of the booster circuit switches from the first booster voltage to the second booster voltage.

6. The semiconductor device as claimed in claim 5, wherein
the discharge controller includes:
a discharge control circuit configured to generate a one-shot pulse signal from a timing when the first booster voltage switches to the second booster voltage; and
a discharger configured to receive the one-shot pulse signal and connect the internal power source line to the ground for discharge.

7. The semiconductor device as claimed in claim 4, the semiconductor device further comprising:
a memory configured to write and read data by using an output voltage of the booster circuit.

8. The semiconductor device as claimed in claim 7, wherein
the memory is a flash memory;
the operating modes include a data write mode and a data read mode; and
in the data write mode, the first booster voltage is supplied to a gate of a memory cell in the flash memory, and
in the data read mode, the second booster voltage is supplied to a drain of the memory cell.

9. The semiconductor device as claimed in claim 8, wherein
the flash memory includes:
a memory cell array where a plurality of memory cells are arranged in a matrix;
an X-decoder configured to be connected to gates of the memory cells arranged in a row direction through a plurality of word lines; and
a Y-decoder configured to be connected to drains of the memory cells arranged in a column direction through a plurality of bit lines, wherein
the first booster voltage is supplied through a first switch circuit to the X-decoder, and
the second booster voltage is supplied through a second switch circuit to the Y-decoder.

\* \* \* \* \*